United States Patent [19]

Bastida

[11] 4,305,049
[45] Dec. 8, 1981

[54] WAVEGUIDE GUNN DIODE OSCILLATOR WITH HARMONIC TUNING

[75] Inventor: Ezio M. Bastida, Segrate, Italy

[73] Assignee: C.I.S.E. Centro Informazioni Studi Esperienze S.p.A., Italy

[21] Appl. No.: 88,974

[22] Filed: Oct. 29, 1979

[30] Foreign Application Priority Data

Oct. 31, 1978 [IT] Italy .............................. 29326 A/78

[51] Int. Cl.³ .............................................. H03B 9/14
[52] U.S. Cl. .............................. 331/96; 331/107 DP; 331/107 G
[58] Field of Search .............. 331/96, 107 DP, 107 C, 331/107 G

[56] References Cited

U.S. PATENT DOCUMENTS

| | | | |
|---|---|---|---|
| 3,510,800 | 5/1970 | Kaneko et al. | 331/107 DP X |
| 3,711,792 | 1/1973 | Kaneko et al. | 331/96 |
| 3,803,514 | 4/1974 | Camp, Jr. | 331/96 X |
| 3,883,822 | 5/1975 | Basset | 331/107 DP |

OTHER PUBLICATIONS

Pollmann et al., "Load Dependence of Gunn–Oscillator Performance", IEEE Transactions on Microwave Theory and Techniques, vol. MTT-18, Nov. 1970, pp. 817–827.

*Primary Examiner*—Siegfried H. Grimm
*Attorney, Agent, or Firm*—Karl W. Flocks; A. Fred Starobin

[57] ABSTRACT

The oscillator comprises a main cavity housing a Gunn diode and auxiliary cavity branching laterally and allowing only inlet of the harmonic components.

The auxiliary cavity is provided with harmonic tuning means for varying the reactance of the auxiliary cavity to the harmonic components. The load impedance seen by the Gunn diode is thus varied.

6 Claims, 5 Drawing Figures

WAVEGUIDE GUNN DIODE OSCILLATOR WITH HARMONIC TUNING

This invention relates to a new type of waveguide Gunn diode oscillator with harmonic tuning.

Waveguide Gunn diode oscillators have for some years been of fundamental importance in modern electronic technology, in which they are used as tunable microwave sources. Other important reasons for this success are their low cost, high reliability and great constructional simplicity.

One simple method of constructing oscillators of this type is to mount the Gunn diode on a cylindrical peg disposed perpendicular to the wider side of the waveguide. Fur tuning purposes, a mobile short-circuiting piston can be provided, or, as in the case of commercial oscillators, a system comprising a dielectric bar and a load coupling iris, or alternatively electronic devices such as a varactor.

The constructional simplicity of these oscillators is contrasted by the considerable complexity of their electromagnetic behaviour. This operational complexity is largely due to the existence of a series of limitations on the performance obtainable with this type of oscillator. In this respect, the facility for obtaining a good power level, effective electronic tuning, low frequency modulation noise and good operating frequency stability with temperature variation is often compromised by certain non-linear phenomena, the mechanisms of which have up to now been largely unknown.

A theoretical and experimental investigation, which for reasons of brevity is not reproduced here, has enabled the cause of all the aforesaid limitations to be identified as the interaction, due to the non-linearity of the diode, between the harmonic frequency components and the fundamental frequency component of the signal present in the oscillating cavity.

The theoretical investigation has shown that by suitably adjusting the load at the harmonic frequencies, and in particular at the second harmonic frequency, the power level, the electronic tuning characteristics (tuning obtainable by adjusting the voltage either across the diode or across a varactor) and the temperature stability of the oscillator operating frequency can be simultaneously optimised. It is also possible to show that the same type of adjustment can be used for reducing the frequency modulation noise level of the oscillator.

As the normal waveguide components are designed to function correctly at the fundamental frequency, it is extremely improbable that load conditions at the harmonic frequency which allow optimum operation are obtained when the oscillator is connected to normal circuits. It is therefore necessary to provide a structure which allows the load at harmonic frequencies to be easily varied in a manner practically independent from the load at the fundamental frequency. This adjustment must be able to be made over the entire tuning band of the oscillator, it being often advantageous to be able to make this band very wide.

The oscillator according to the invention satisfies all the aforesaid requirements. It comprises, as is usual, a main cavity extending over the entire length of the waveguide and housing a Gunn diode mounted perpendicular to the direction of extension of the waveguide, and means for adjusting the tuned frequency of said main cavity, and further comprises an auxiliary cavity branching laterally from said main cavity which is of such dimensions as to prevent inlet of the fundamental component of said tuned frequency but to allow inlet of the harmonic components, said auxiliary cavity housing harmonic tuning means arranged to vary the load impedance seen by the Gudd diode at the harmonic frequencies by varying the reactance of said auxiliary cavity to the harmonic components.

In other words, the oscillator according to the invention is based on the concept that by associating, with a normal resonant cavity of a waveguide, an auxiliary cavity capable of receiving only the harmonic frequency components of the signal present in the main cavity, and by suitably varying the reactance of said auxiliary cavity to the harmonic components, it is possible to vary the load impedance seen by the Gunn diode at the harmonic frequencies alone, while the load at the fundamental frequency remains unaltered and corresponding to the design load.

Some non-limiting embodiments of the oscillator according to the invention are shown for greater clarity in the accompanying drawings in which.

Figure 1:
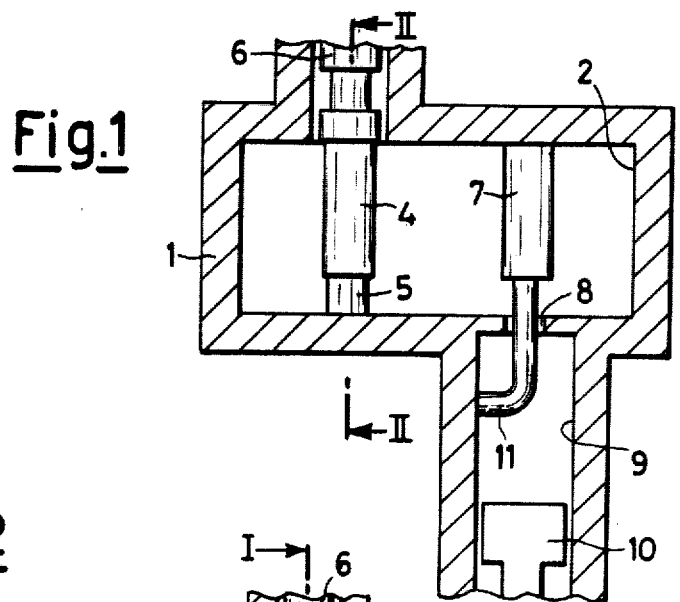
FIG. 1 is a cross-section through a waveguide Gunn diode oscillator according to the invention, taken on the line I—I of FIG. 2.
Figure 2:
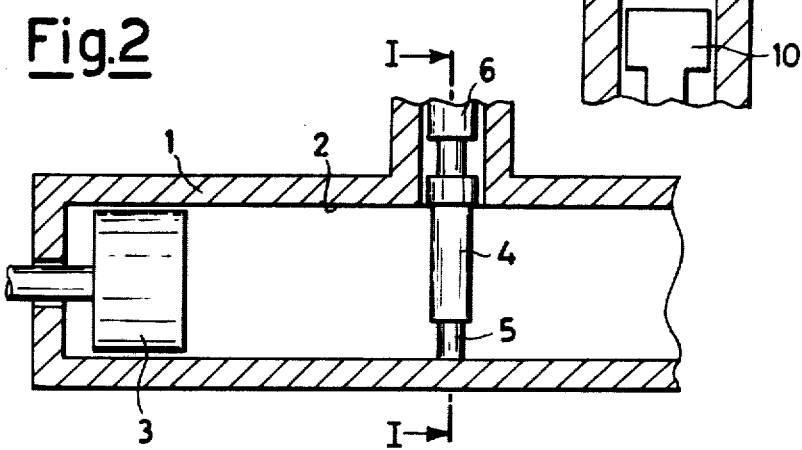
FIG. 2 is a longitudinal section through said oscillator on the line II—II of FIG. 1.

The oscillator shown in FIGS. 1 and 2 comprises a waveguide 1 containing a main resonant cavity 2 of constant rectangular cross-section. Said main cavity, which is closed by a mobile short-circuiting piston 3 at the opposite end to the connection end for the load (not shown), houses below a column 4 a Gunn diode 5, which is polarised by a low-pass filter 6. Parallel to the diode 5 and in its same transverse plane with respect to the extension of the waveguide, there is also disposed in the cavity 2 a column 7 having the same dimensions as the column 4.

An auxiliary cylindrical cavity 9 provided with a mobile tuning piston 10 communicates with the main cavity 2 by way of a restricted passage 8. The transverse dimensions of the cavity 9, possibly in combination with those of the passage 8, in which case completely clear, are chosen to prevent inlet of the fundamental component of the signal present in the main cavity 2, while allowing inlet of the harmonic components. An antenna wire 11 passes through the communication passage 8 to electrically connect the column 7 to the wall of the auxiliary cavity 9.

In operation, whereas the short-circuiting piston 3 (FIG. 2) enables the tuned frequency of the main cavity 2 to be adjusted, the harmonic tuning piston 10 enables the reactance of the auxiliary cavity 9 to only the harmonic components of the signal present in the main cavity 2 to be varied with the length of the auxiliary cavity 9, the fundamental component being prevented from entering the auxiliary cavity 9 as stated heretofore. This is equivalent to presenting to the double gate system constituted by the two pairs of facing surfaces A—A' and B—B' (FIG. 3) a reactance capable of assuming all possible imaginary values over the range $(-j\infty, +j\infty)$. The result is a corresponding variation in the load impedance seen by the Gunn diode 5 at the harmonic frequencies.

Figure 3:
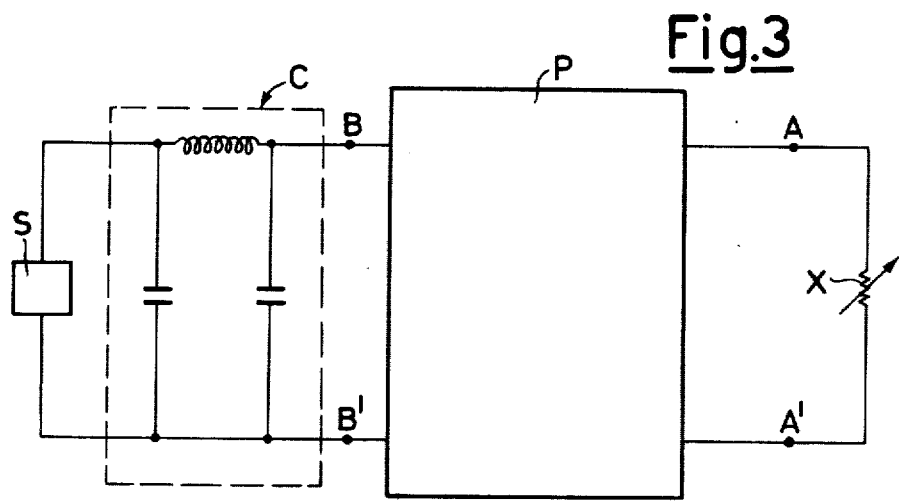
FIG. 3 is the equivalent electrical circuit of said oscillator.

The equivalent electrical circuit of the system shown in FIG. 1 is represented in FIG. 3, where X indicates the variable reactance deriving from the auxiliary cavity 9, P the double gate system A—A', B—B', C the protection capsule for the Gunn diode 5, and S the actual semiconductor disposed inside said capsule.

Figure 4:
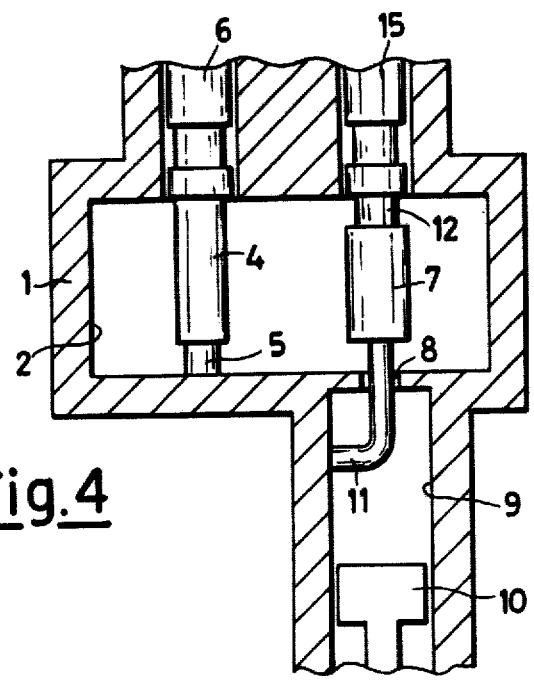
FIG. 4 is a representation, similar to FIG. 1, of a modification of said oscillator.
Figure 5:
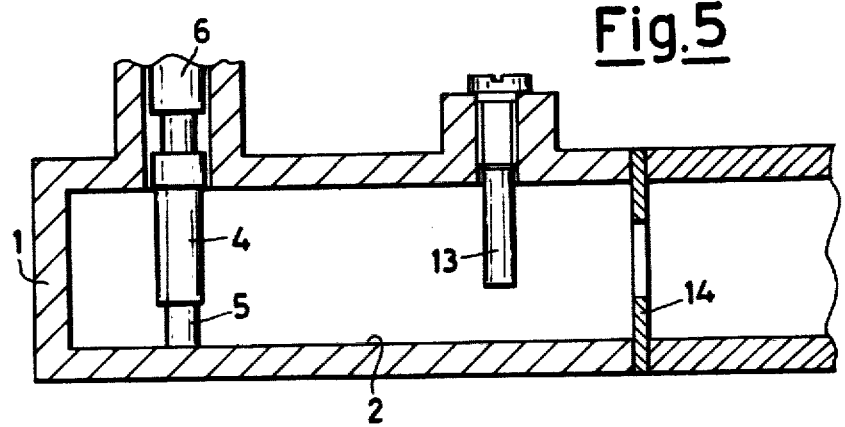
FIG. 5 is a representation, similar to FIG. 2, of a further modification of said oscillator.

FIG. 4 shows a modification in which the main cavity 2 is tuned by a varactor 12 with a superposed filter 15 mounted on the column 7, while FIG. 5 shows a further modification in which the main cavity 2 is tuned by a dielectric bar 13 and an iris 14. Experimental results obtained with this oscillator arrangement according to the invention have shown that with loads which strongly reflect at the harmonics (including the case of an oscillator with an iris), the output power level can be varied by harmonic tuning alone, by about 5 dB over the entire wide mechanical tuning band of the oscillator (8.2–14 GHz in the case of the waveguide oscillator WR-90 in the configuration with the short-circuiting piston). In addition, both in the case of varactor tuning and tuning by the voltage applied across the diode, the harmonic effect alone produces a drastic improvement in the linearity of the tuning (in the case of varactor tuning, it improved from a percentage deviation of 8% to one of 0.5%) with a simultaneous strong reduction in the signal amplitude variations. The high linearity of the modulation curves thus obtainable, which is much better than that which can be obtained by simply eliminating the harmonic components of the signal by absorption, shows the possibility of utilising harmonic tuning in order to minimise the effects due to intrinsic non-linearities in the modulation mechanism (it should be noted in this respect that the capacity of a varactor is proportional to the square root of the applied voltage). It has also been observed that harmonic tuning gives a variation of about 6 dB in the temperature coefficient df/dT of the oscillator operating frequency. When operating with mechanical frequency compensation—utilising materials having coefficients of thermal expansion which are different from each other—the facility for continuously varying this temperature coefficient enables complicated calibration procedures to be avoided and to extend the operation of a temperature compensated structure to a wider frequency range, and to devices having a less stringent statistical quality distribution.

It is important to note that, as confirmation of the theoretical assumption, the power level, the electronic tuning characteristics and the temperature stability of the oscillator frequency can be optimised simultaneously.

Finally, the same type of harmonic tuning gives substantial reduction (sometimes exceeding 10 dB) in the F.M. noise of the oscillator. However, this occurs normally for auxiliary cavities having a length different from that which optimises all the other parameters.

What I claim is:

1. A waveguide Gunn-diode oscillator comprising
   a main cavity extending for the entire length of the waveguide and housing a Gunn-diode mounted perpendicular to the direction of extension of the waveguide;
   and means for regulating the tuning frequency of said main cavity further including
      an auxiliary cavity branching laterally from said main cavity and in communication with it through a passage therebetween,
      said auxiliary cavity being positioned on an equiphase plane with said Gunn-diode in said main cavity,
      said auxiliary cavity having dimensions such as to impede the entry into said auxiliary cavity of the fundamental component of a signal present in said main cavity and to permit the entry of the harmonic components of said signal,
      a column housed parallel to said Gunn-diode in a symmetrical position with respect to said Gunn-diode in said main cavity,
      an antenna wire traversing said passage of communication between said main cavity and said auxiliary cavity, and having one extremity terminating against a part of said auxiliary cavity and the other extremity attached to said column, constituting a variable reactance double gate element positioned in series with said Gunn-diode,
      harmonic tuning means housed in said auxiliary cavity suitable for causing a variation in the load impedance seen by said Gunn-diode at the frequencies of the harmonic components of said signal in said main cavity, by means of variation of the reactance of said auxiliary cavity to the harmonic components.

2. An oscillator as claimed in claim 1, wherein said harmonic tuning means are constituted by a mobile piston arranged to vary the dimensions of said auxiliary cavity.

3. An oscillator as claimed in claim 1, wherein said means for regulating the tuning frequency of the main cavity are constituted by a mobile short-circuiting piston.

4. An oscillator as claimed in claim 1, wherein said means for regulating the tuning frequency of the main cavity are constituted by a dielectric bar associated with an iris.

5. An oscillator as claimed in claim 1, wherein said means for regulating the tuning frequency of the main cavity are constituted by a varactor.

6. An oscillator as claimed in claim 1, wherein said means for regulating the tuning frequency of the main cavity are constituted by means for varying the polarisation voltage of the Gunn diode.

* * * * *